United States Patent
Haynie et al.

(10) Patent No.: US 8,492,255 B2
(45) Date of Patent: Jul. 23, 2013

(54) TRENCHED SCHOTTKY DIODE AND METHOD OF FORMING A TRENCHED SCHOTTKY DIODE

(75) Inventors: Sheldon D. Haynie, San Martin, CA (US); Ann Gabrys, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 295 days.

(21) Appl. No.: 12/986,107

(22) Filed: Jan. 6, 2011

(65) Prior Publication Data

US 2012/0175724 A1 Jul. 12, 2012

(51) Int. Cl.
*H01L 21/28* (2006.01)

(52) U.S. Cl.
USPC .... 438/576; 438/534; 438/571; 257/E21.238; 257/E21.351

(58) Field of Classification Search
USPC ............... 438/534, 570, 571, 576, 581, 583; 257/E21.238, E21.351
See application file for complete search history.

(56) References Cited

U.S. PATENT DOCUMENTS

| | | | |
|---|---|---|---|
| 6,855,999 B2 * | 2/2005 | Hwang et al. | 257/483 |
| 2007/0287276 A1 * | 12/2007 | Drobny | 438/570 |
| 2011/0042775 A1 * | 2/2011 | Doi et al. | 257/475 |

FOREIGN PATENT DOCUMENTS

JP 04290266 A * 10/1992

* cited by examiner

*Primary Examiner* — Matthew E Warren
(74) *Attorney, Agent, or Firm* — Eugene C. Conser; Wade J. Brady, III; Frederick J. Telecky, Jr.

(57) ABSTRACT

A Schottky diode with a small footprint and a high-current carrying ability is fabricated by forming an opening that extends into an n-type semiconductor material. The opening is then lined with a metallic material such as platinum. The metallic material is then heated to form a salicide region where the metallic material touches the n-type semiconductor material.

2 Claims, 16 Drawing Sheets

US 8,492,255 B2

TRENCHED SCHOTTKY DIODE AND METHOD OF FORMING A TRENCHED SCHOTTKY DIODE

BACKGROUND OF THE INVENTION

1. Field of the Invention

The present invention relates to Schottky diodes and, more particularly, to a method of forming trenched Schottky diodes.

2. Description of the Related Art

A Schottky diode is a well-known structure with a metal-to-silicon junction that functions as a diode. Schottky diodes have a forward voltage drop that is lower than the forward voltage drop of a conventional pn diode (e.g., 0.35V versus 0.7V) and a switching action that is faster than the switching action of a conventional pn diode (e.g., 100 ps versus 100 ns).

FIGS. 1A-1C show views that illustrate an example of a conventional Schottky diode 100. FIG. 1A shows a plan view, FIG. 1B shows a cross-sectional view taken along line 1B-1B of FIG. 1A, and FIG. 1C shows a cross-sectional view taken along line 1C-1C of FIG. 1A. As shown in FIGS. 1A-1C, Schottky diode 100 includes an n-type semiconductor material 110, such as an n-type substrate, epitaxial layer, or well, and a shallow trench isolation (STI) ring 112 that is formed in semiconductor material 110.

As further shown in FIGS. 1A-1C, Schottky diode 100 includes an n+ ring 114 and a p+ guard ring 116 that are formed in semiconductor material 110 on opposite sides of STI ring 112. Schottky diode 100 also includes a metal ring 120 that touches the top surface of n+ ring 114, and a metal region 122 that touches the top surface of semiconductor material 110 and p+ guard ring 116. Metal ring 120 and metal region 122 are commonly formed with a silicide, such as platinum silicide.

In addition, Schottky diode 100 includes a non-conductive layer 130 that touches the top surfaces of the STI region 112, the metal ring 120, and the metal region 122, a number of first contacts 132 that extend through non-conductive layer 130 to make electrical connections with metal ring 120, and a number of second contacts 134 that extend through non-conductive layer 130 to make electrical connections with metal region 122.

In operation, metal region 122 functions as the anode of the diode and semiconductor material 110 functions as the cathode of the diode. In addition, n+ ring 114 functions as the cathode contact, while p+ guard ring 116 reduces the leakage current.

As a result, when the voltage applied to metal region 122 rises above the voltage applied to semiconductor material 110 by approximately 0.35V, a current flows from metal region 122 to n+ ring 114. On the other hand, when the voltage applied to metal region 122 falls below the voltage applied to semiconductor material 110, substantially no current flows from n+ ring 114 to metal region 122.

BRIEF DESCRIPTION OF THE DRAWINGS

FIG. 1A is a plan view, FIG. 1B is a cross-sectional view taken along line 1B-1B of FIG. 1A, and FIG. 1C is a cross-sectional view taken along line 1C-1C of FIG. 1A.

FIGS. 2A-7A are partial plan views, while FIGS. 2B-7B are cross-sectional views taken along lines 2B-2B through 7B-7B of FIGS. 2A-7A, respectively.

FIGS. 8A-16A are partial plan views, while FIGS. 8B-16B are cross-sectional views taken along lines 8B-8B through 16B-16B of FIGS. 8A-16A, respectively.

DETAILED DESCRIPTION OF THE INVENTION

FIGS. 2A-2B through FIGS. 7A-7B shows views that illustrate an example of a method of forming a trenched Schottky diode in accordance with the present invention. FIGS. 2A-7A are partial plan views, while FIGS. 2B-7B are cross-sectional views taken along lines 2B-2B through 7B-7B of FIGS. 2A-7A, respectively.

Figure 1A:
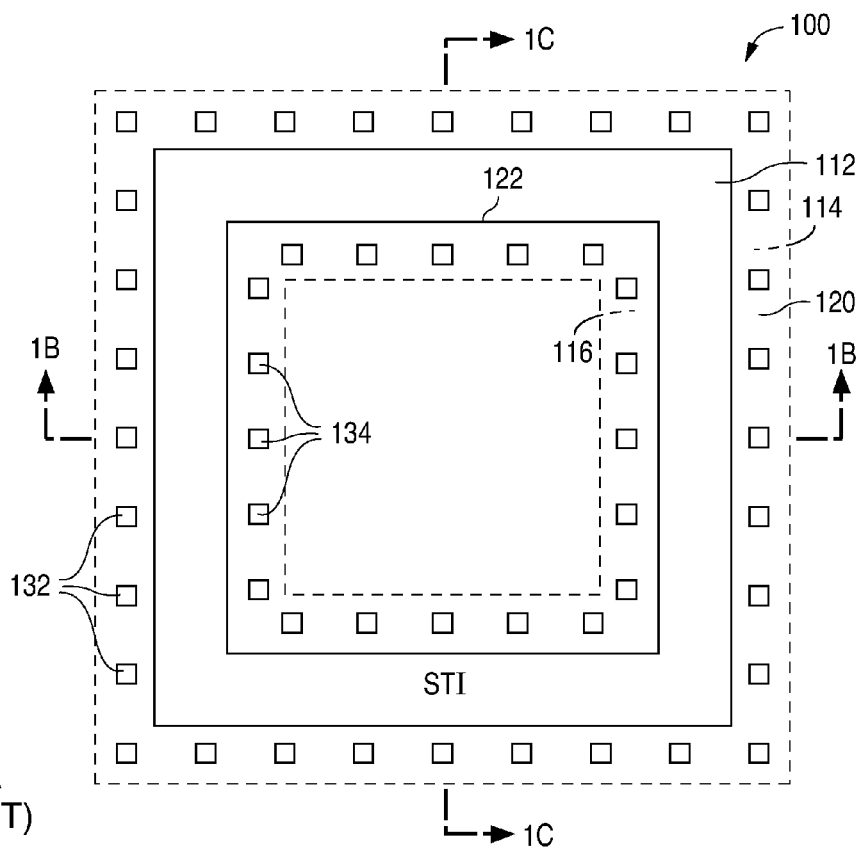
FIGS. 1A-1C are views illustrating an example of a conventional Schottky diode 100.
Figure 1B:
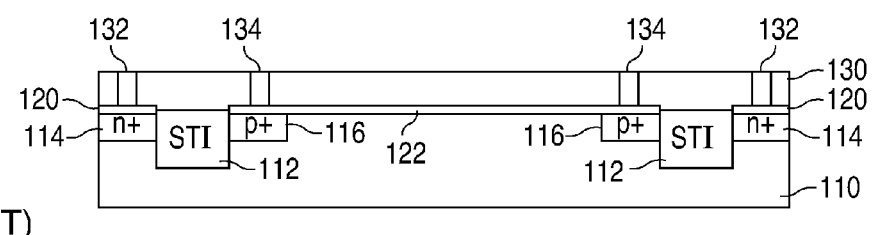
Figure 1C:
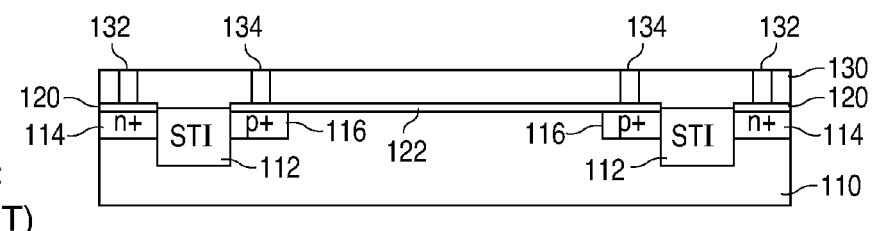
Figure 2A:
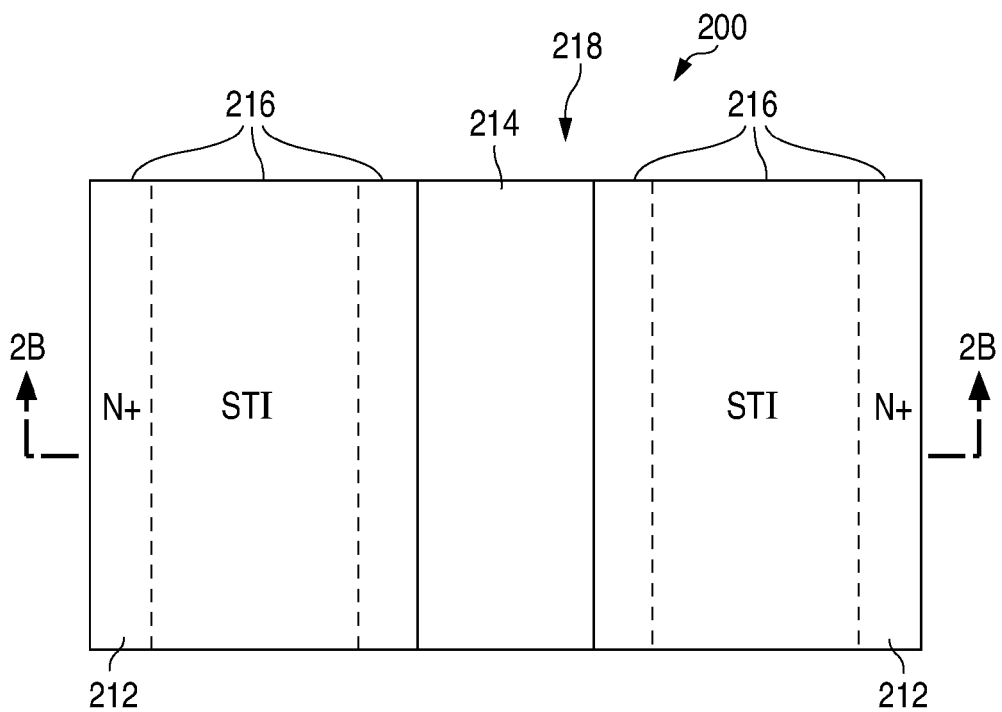
FIGS. 2A-2B through FIGS. 7A-7B are views illustrating an example of a method of forming a trenched Schottky diode in accordance with the present invention.
Figure 2B:
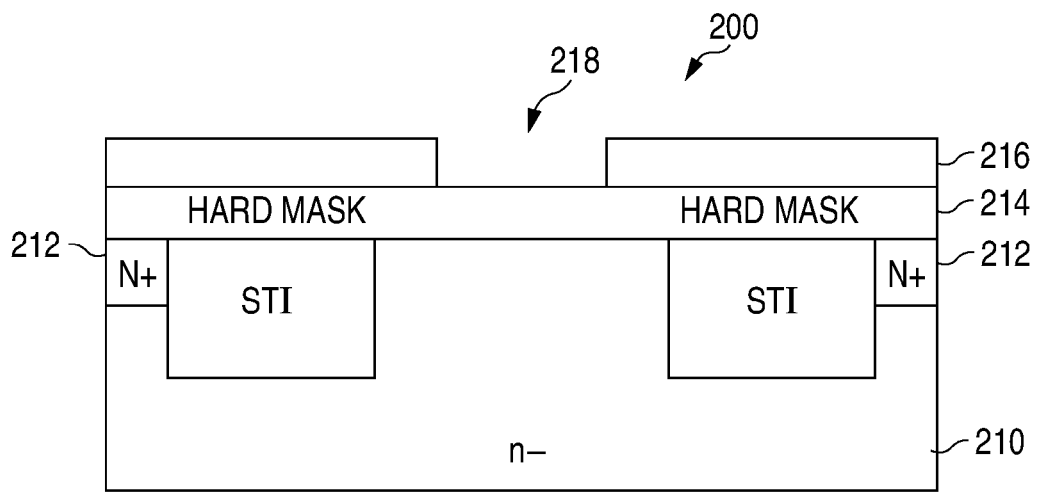

As shown in FIGS. 2A-2B, the method utilizes a conventionally formed wafer 200 that includes an n-type semiconductor material 210, such as an n-type substrate, epitaxial layer, or well. In the present example, wafer 200 also includes a shallow trench isolation ring STI, and a n+ ring 212 that have been formed in n-type semiconductor material 210 so that n+ ring 212 laterally surrounds and touches isolation ring STI.

As further shown in FIGS. 2A-2B, the method begins by depositing a hard mask layer 214 on to the top surfaces of n-type semiconductor material 210, isolation ring STI, and n+ ring 212. After hard mask layer 214 has been deposited, a patterned photoresist layer 216 is formed on the top surface of hard mask layer 214.

Patterned photoresist layer 216 has a photoresist opening 218 that exposes the top surface of hard mask layer 214. Patterned photoresist layer 216 is formed in a conventional manner, which includes depositing a layer of photoresist, projecting a light through a patterned black/clear glass plate known as a mask to form a patterned image on the layer of photoresist, and removing the imaged photoresist regions, which were softened by exposure to the light.

Figure 3A:
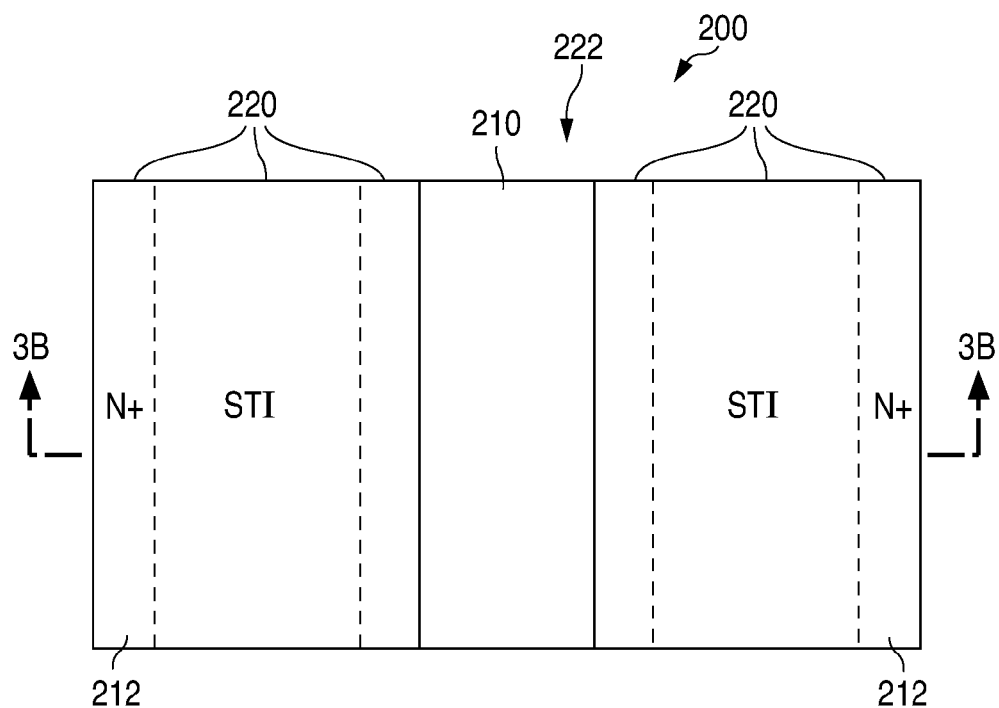
Figure 3B:
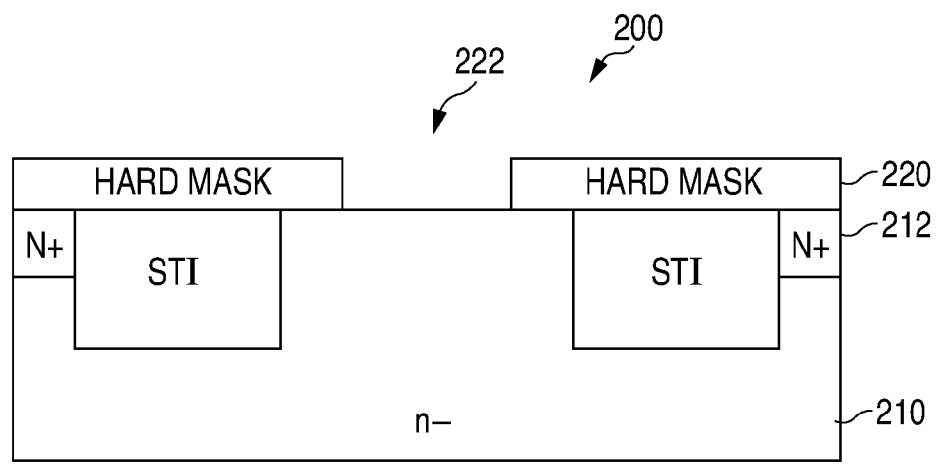

As shown in FIGS. 3A-3B, after patterned photoresist layer 216 has been formed, the exposed region of hard mask layer 214 is etched in a conventional manner to form a hard mask 220 which has an opening 222 that exposes the top surface of n-type semiconductor material 210. Following this, patterned photoresistor layer 216 is removed using well-known solvents and processes.

Figure 4A:
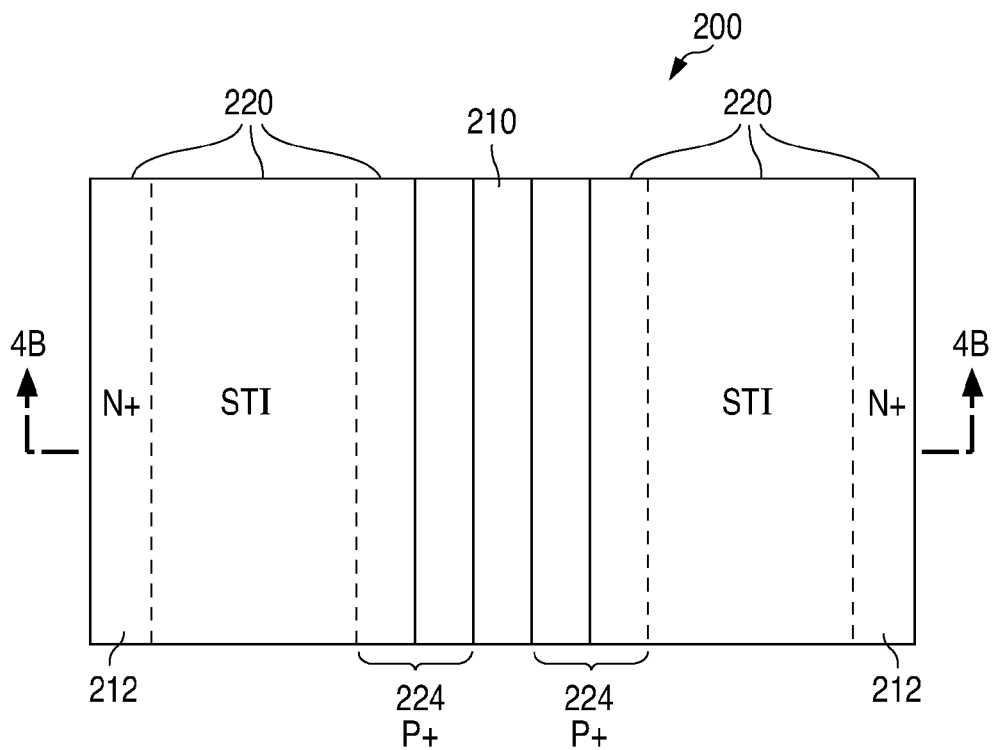
Figure 4B:
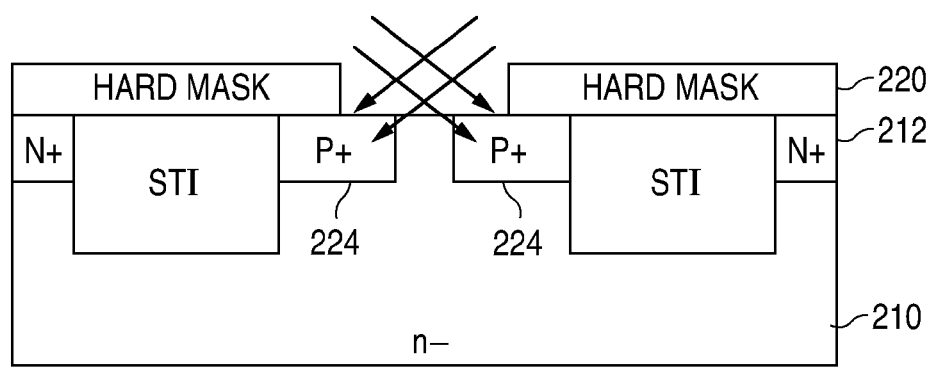

Once patterned photoresist layer 216 has been removed, as shown in FIGS. 4A-4B, a p-type dopant, such as boron, is implanted into n-type semiconductor material 210 to form p+ region 224. The p-type dopant is implanted at an angle in a conventional manner to form p+ region 224 as a p+ guard ring.

Figure 5A:
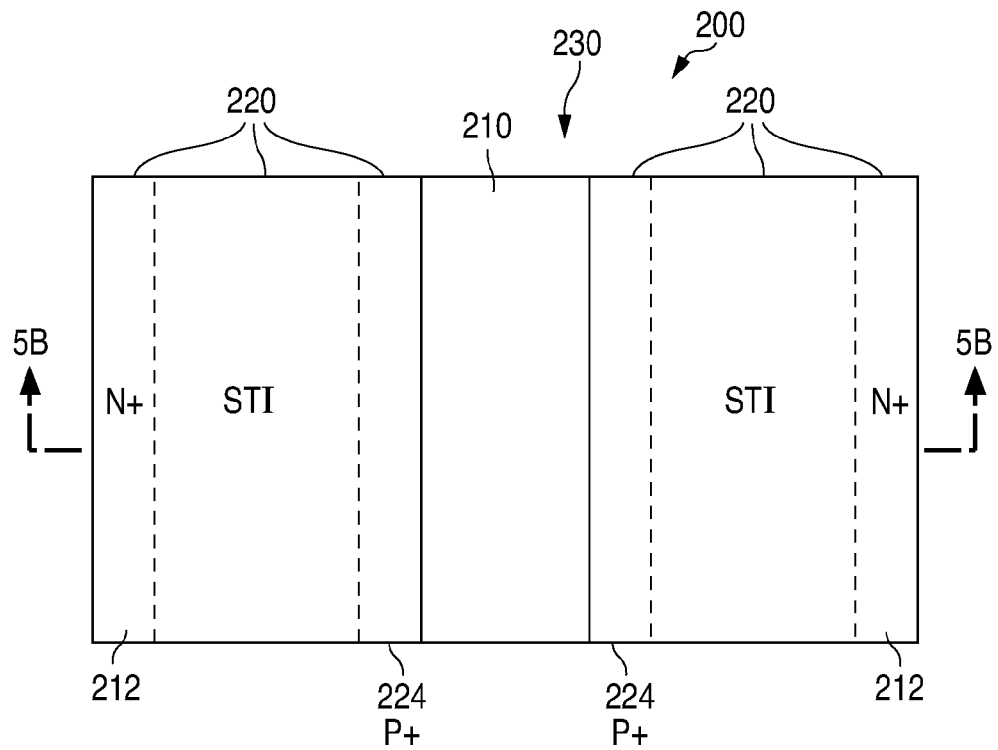
Figure 5B:
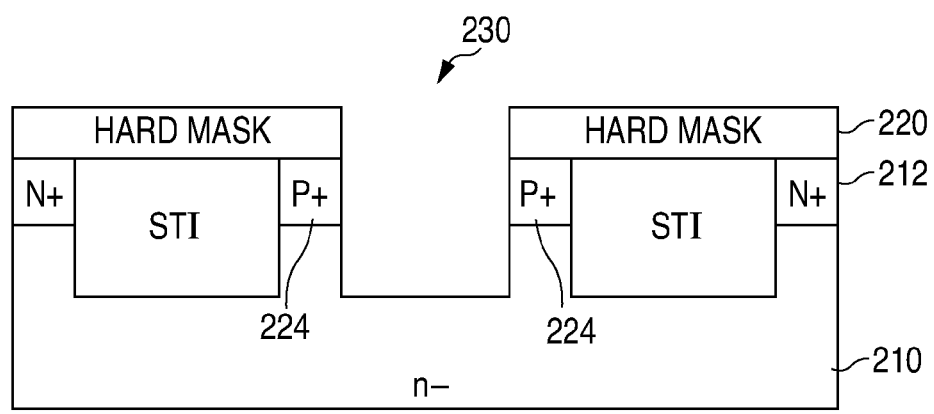

As shown in FIGS. 5A-5B, following the implant of p+ guard ring 224, n-type semiconductor material 210 is etched in a conventional manner to form an opening 230 that extends down from the top surface of n-type semiconductor material 210 a distance into n-type semiconductor material 210.

Figure 6A:
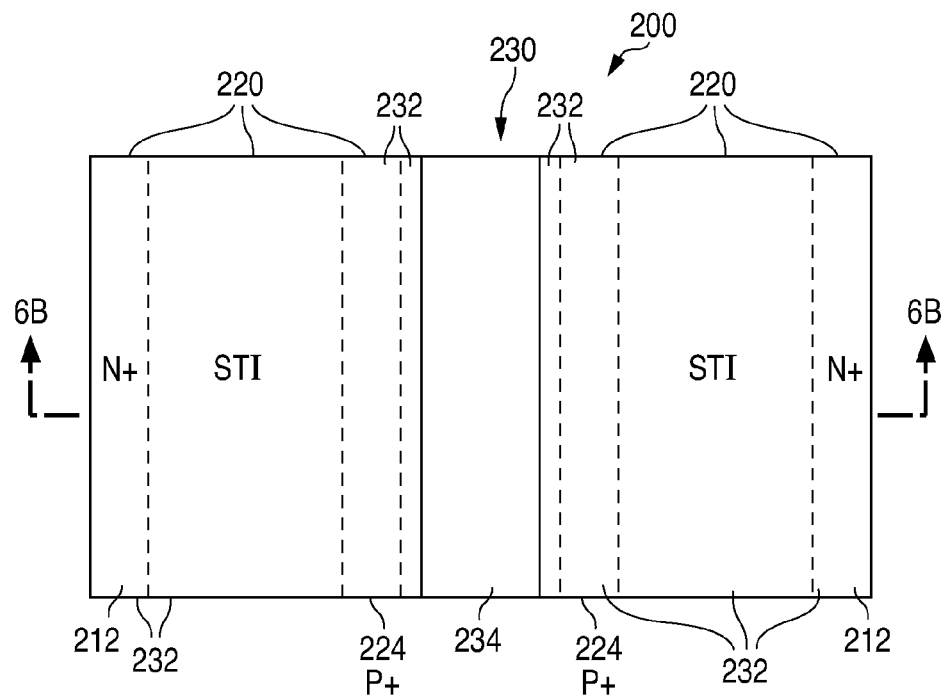
Figure 6B:
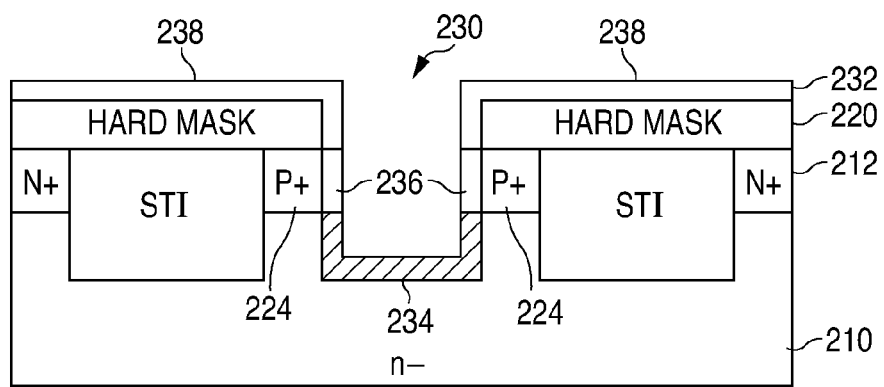

As shown in FIGS. 6A-6B, after opening 230 has been formed, a metal layer 232 is deposited in a well-known manner on the top surface of hard mask 220 to touch p+ guard ring 224 and n-type semiconductor material 210. Metal layer 232, which lines opening 230, can be implemented with, for example, platinum.

After metal layer 232 has been deposited, metal layer 232 is heated to react with the underlying semiconductor structures in a conventional manner to form a salicide region 234 that touches n-type semiconductor material 210, a salicide region 236 that touches p+ guard ring 224, and a non-salicide region 238 that touches hard mask 220. The salicide regions 234 and 236 are low-resistance silicon-to-metal transition regions. (Metal layer 232 can optionally be etched so that metal layer 232 only touches n-type semiconductor material 210.)

For example, if metal layer 232 is implemented with platinum, the layer of platinum that touches n-type semiconductor material 210 can be converted into platinum salicide region 234 by a conventional sintering process. The portion of p+ guard ring 224 that touches metal layer 232 is also salicided at the same time, but the portion of metal layer 232 that touches hard mask 220 does not react, and thereby forms non-salicide region 238.

Figure 7A:
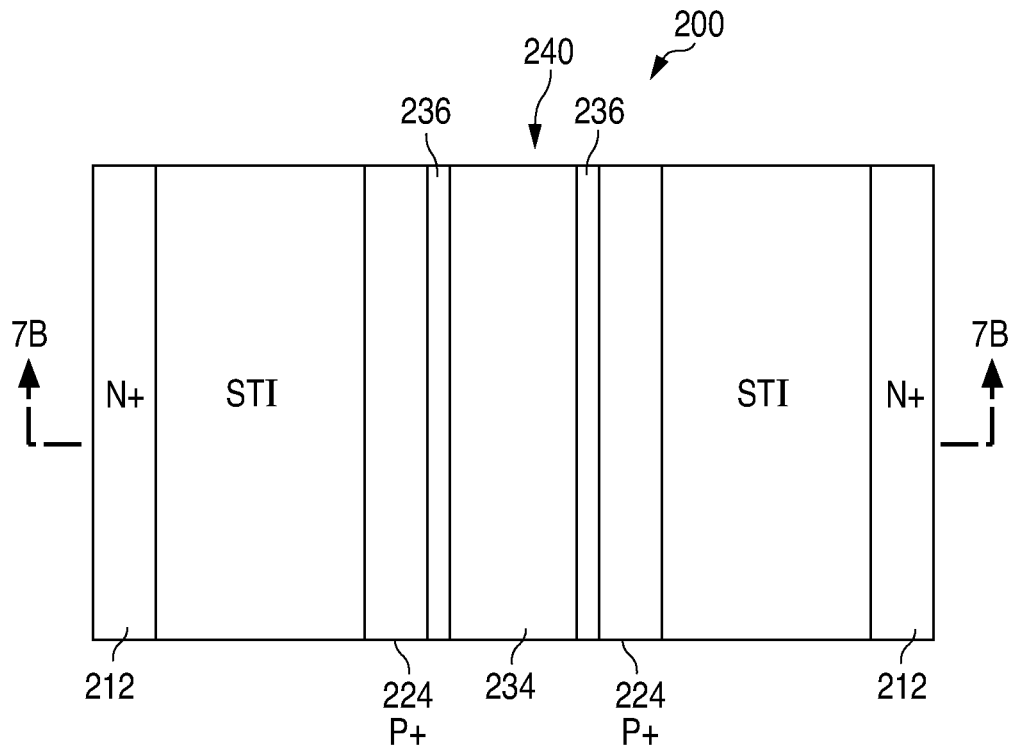
Figure 7B:
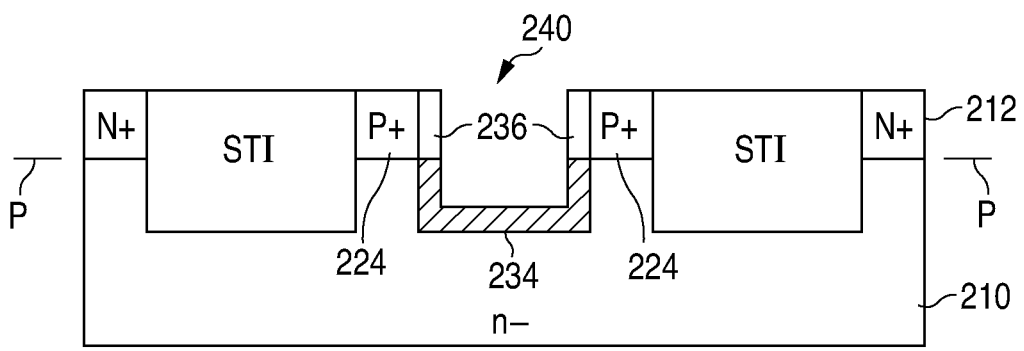

As shown in FIGS. 7A-7B, after metal salicide regions 234 and 236 and non-salicide region 238 have been formed, wafer 200 is planarized in a conventional manner, such as with chemical-mechanical polishing, to remove non-salicide region 238 (the portion of metal layer 232) that lies above hard mask 220).

In addition, in the present example, wafer 200 is further planarized to remove hard mask 220 from the top surface of the isolation ring STI to form a Schottky diode 240. Following this, the method continues with conventional steps, including forming an overlying non-conductive layer, and metal contact structures that extend through the non-conductive layer to make electrical connections to n+ ring 212 and salicide region 234. N+ ring 212 can also be salicided to reduce resistivity, and can be salicided at the same time that the source, drain, and gate structures are salicided in a standard CMOS process flow.

In operation, salacide region 234 functions as the anode of the diode and n-type semiconductor material 210 functions as the cathode of the diode. In addition, n+ ring 212 functions as the cathode contact, while p+ guard ring 224 reduces the leakage current. Thus, a trenched Schottky diode and a method of forming a trenched Schottky diode have been disclosed.

One of the advantages of the trenched Schottky diode of the present invention is that salicide region 234, which lies below a plane P that touches the lowest portion of p+ guard ring 224, touches substantially more of n-type semiconductor material 210 (because of the depth and side walls of opening 230) than does a conventional Schottky diode which only touches a planar top surface area. Thus since salicide region 234 touches a larger region of semiconductor material than a conventional salicided region, the current density of Schottky diode 240 is substantially larger than the current density of a conventional Schottky diode.

In other words, a conventional Schottky diode would only touch a portion of the planar top surface of a semiconductor material, whereas the trenched Schottky diode of the present invention touches n-type semiconductor material 210 along the bottom surface of opening 230 as well as along a portion of the side walls of opening 230.

Another advantage of the trenched Schottky diode of the present invention is that the trenched Schottky diode can be integrated into a laterally-diffused metal-oxide semiconductor (LDMOS) device to provide a Schottky-clamped LDMOS device that does not require any additional silicon surface real estate.

FIGS. 8A-8B through FIGS. 16A-16B show views that illustrate an example of a method of forming a Schottky-clamped LDMOS in accordance with the present invention. FIGS. 8A-16A are partial plan views, while FIGS. 8B-16B are cross-sectional views taken along lines 8B-8B through 16B-16B of FIGS. 8A-16A, respectively.

Figure 8A:
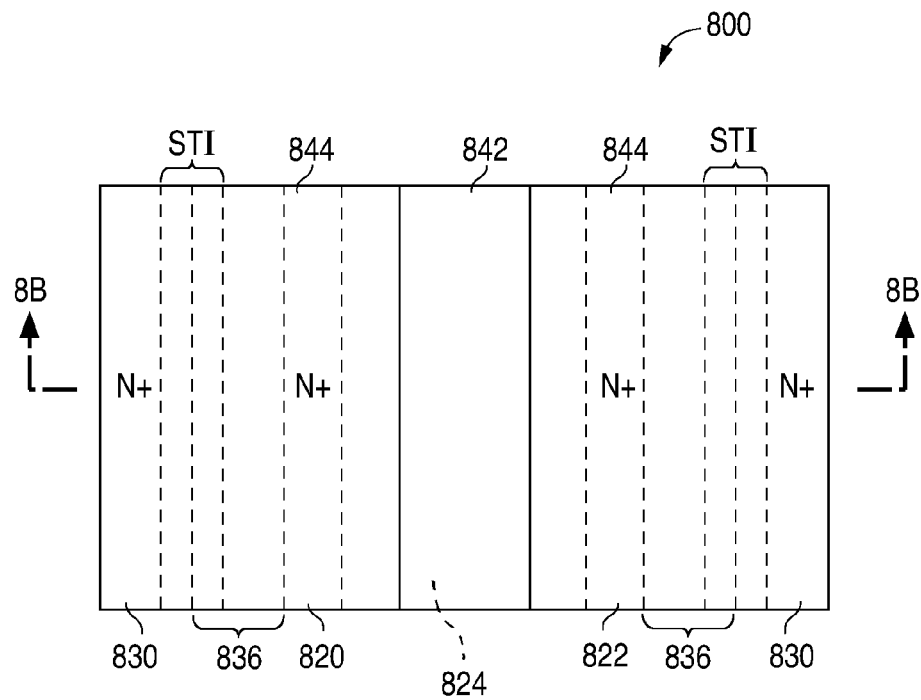
FIGS. 8A-8B through FIGS. 16A-16B are views illustrating an example of a method of forming a Schottky-clamped LDMOS in accordance with the present invention.
Figure 8B:
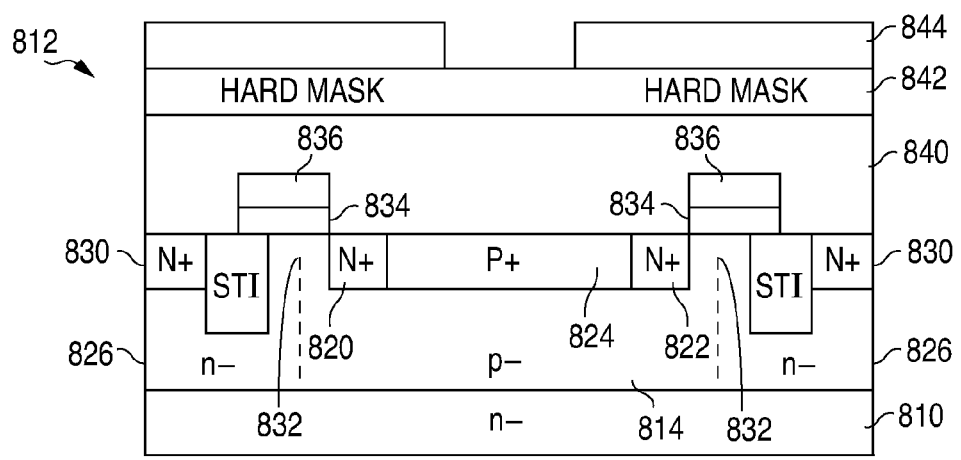

As shown in FIGS. 8A-8B, the method utilizes a conventionally-formed semiconductor wafer 800 that includes an n-type semiconductor material 810, such as an n-type epitaxial layer, and an LDMOS 812 that has been conventionally formed in n-type semiconductor material 810.

LDMOS 812, in turn, includes a number of spaced-apart p-type body regions 814 that have been formed in n-type semiconductor material 810. (Only one p-type body region 814 is shown for clarity.) In addition, LDMOS 812 includes a pair of spaced-apart n+ source regions 820 and 822 that are formed in each p-type body region 814, and a p+ contact region 824 that is formed in each p-type body region 814 to lie between and touch the pair of spaced-apart n+ source regions 820 and 822.

Further, LDMOS 812 includes a number of spaced-apart n-type drain extension regions 826 that touch the p-type body regions 814, a number of spaced-apart n+ drain regions 830 that are formed in the n-type drain extension regions 826, and a shallow trench isolation structure STI that is formed in n-type semiconductor material 810 so that an isolation region STI lies between the source and drain regions of the LDMOS. (The shallow trench isolation structure STI can alternately be formed from, for example, the well-known local oxidization of silicon process.)

LDMOS 812 also includes a number of spaced-apart channel regions 832 that lie horizontally between each adjacent pair of an n+ source region 820 and an n+ drain region 830, and horizontally between each adjacent pair of an n+ source region 822 and an n+ drain region 830. In addition, LDMOS 812 includes a number of gate oxide regions 834 that touch and lie over each channel region 832. Each gate oxide region 834 touches a portion of the top surface of a p-type body region 814 and a portion of the top surface of an n-type drain extension region 826.

Further, LDMOS 812 includes a number of gates 836 and a non-conductive layer 840. Each of the gates 836 touches a gate oxide region 834 and lies over a channel region 832. Non-conductive layer 840, which can be implemented with, for example, oxide, lies over and touches the shallow trench isolation structure STI, the n+ source regions 820 and 822 and the p+ contact region 824 in each p-type body region 814, the drain regions 830, and the gates 836.

Figure 9A:
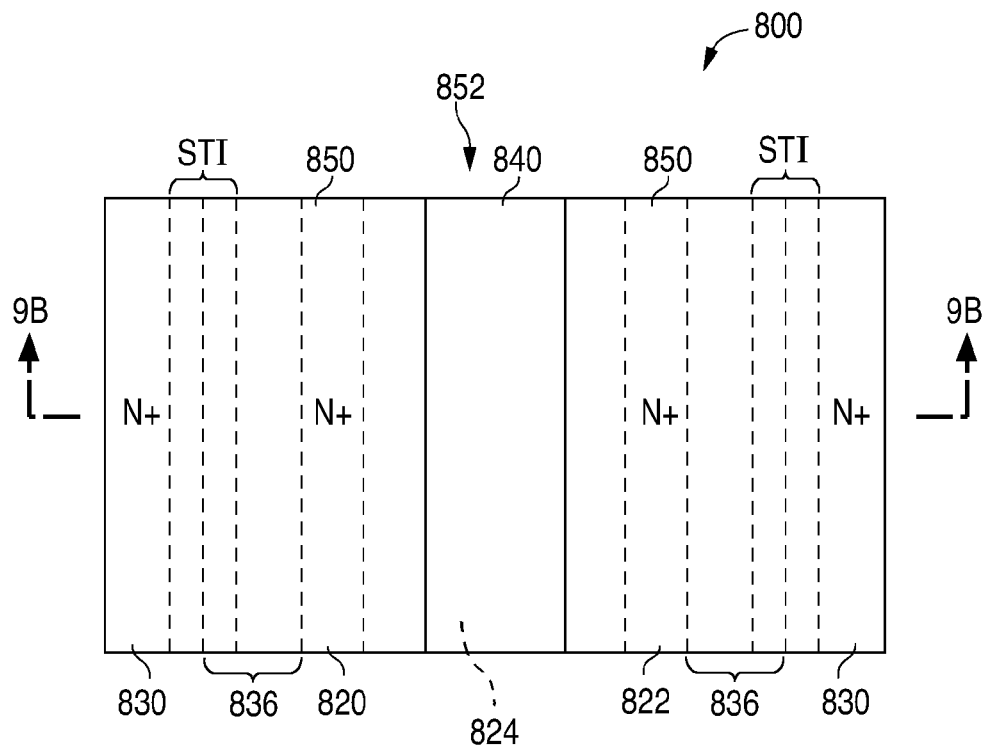
Figure 9B:
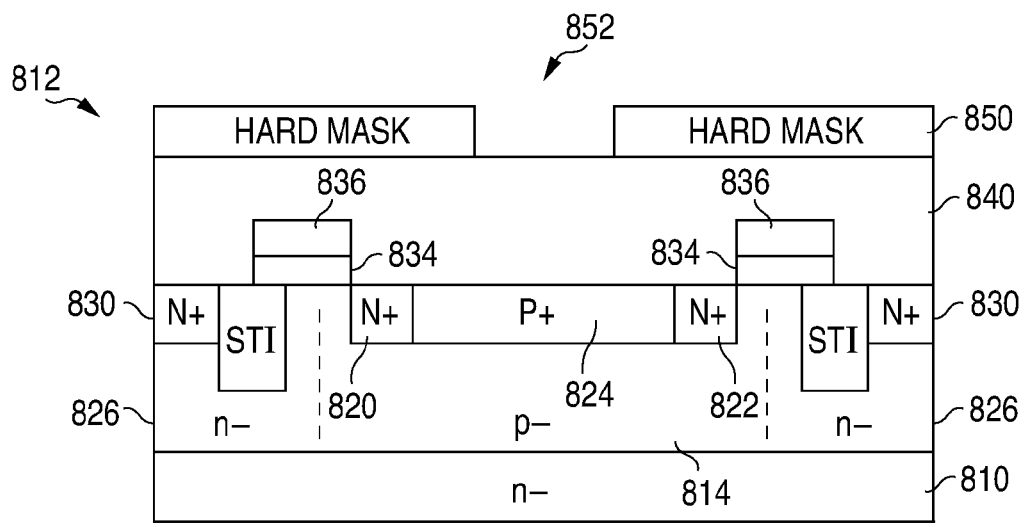

Referring again to FIGS. 8A-8B, the method of the present invention begins by forming a hard mask layer 842 on non-conductive layer 840. Next, a patterned photoresist layer 844 is formed on the top surface of hard mask layer 842 in a conventional manner. As shown in FIGS. 9A-9B, after patterned photoresist layer 844 has been formed, the exposed regions of hard mask layer 842 are etched in a conventional manner to form a hard mask 850 which has a number of openings 852 that expose the top surface of non-conductive layer 840. Following this, patterned photoresistor layer 844 is removed using well-known solvents and processes.

Figure 10A:
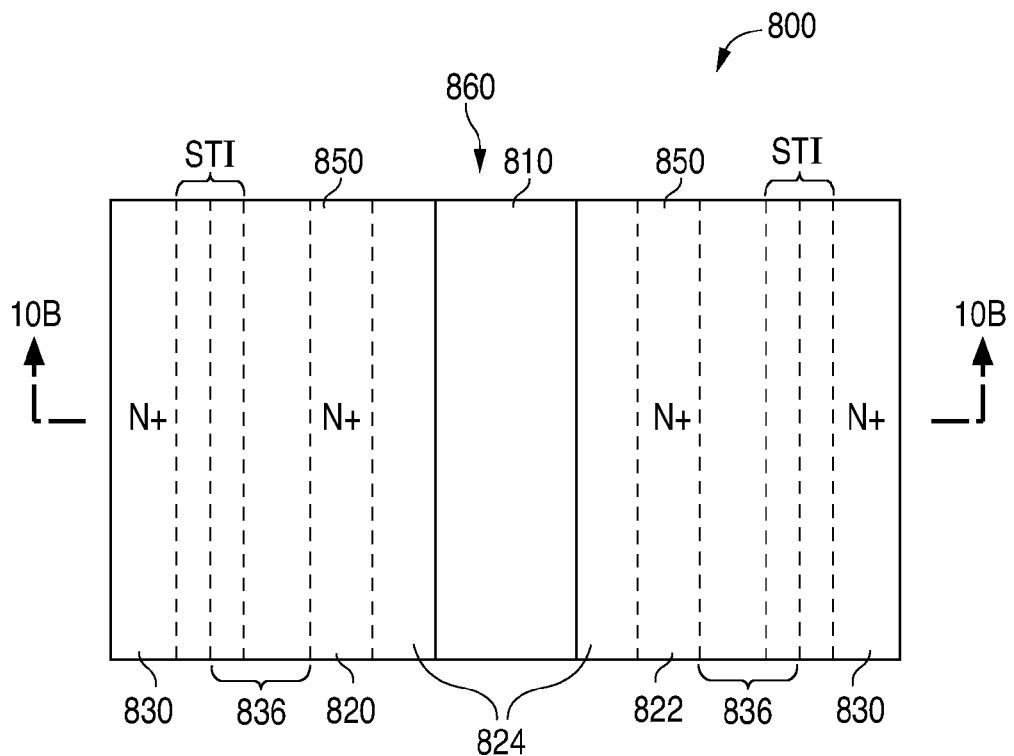
Figure 10B:
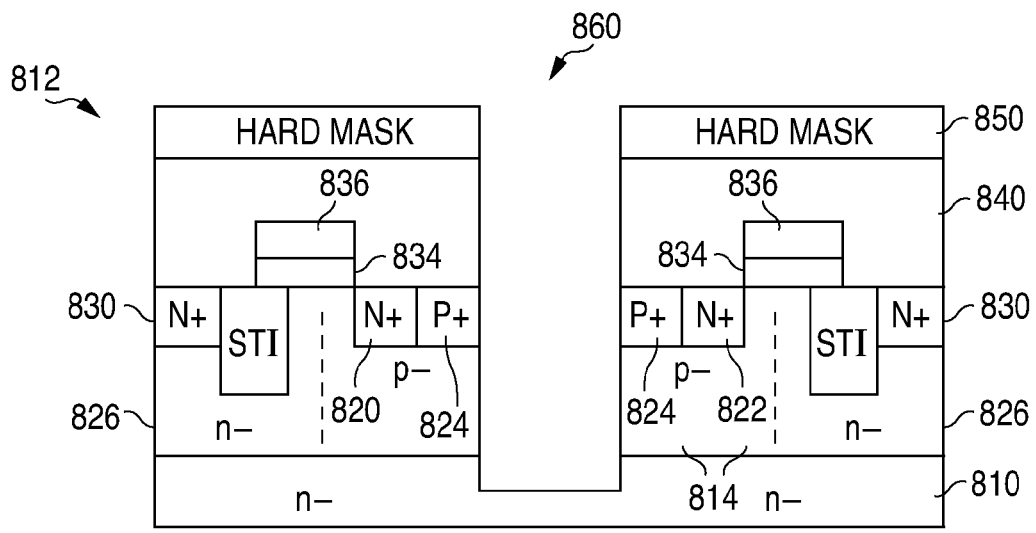

Once patterned photoresist layer 844 has been removed, as shown in FIGS. 10A-10B, non-conductive layer 840, p+ contact region 824, p-type body region 814, and a portion of n-type semiconductor material 810 are sequentially etched in a conventional manner to form a number of trenches 860 that each extends down from the top surface of non-conductive layer 840 into n-type semiconductor material 810. (Only one trench 860 is shown for clarity.)

Unlike the steps discussed in FIGS. 4A-4B, there is no need to perform an angled implant to form a p+ guard region because the trenches 860 each extend through a p+ contact region 824 which, in turn, functions as a p+ guard region.

Thus, the angled implant step to form p+ guard ring 224 in FIGS. 4A-4B can be omitted whenever the openings 230 are formed through a region which can function as a p+ guard ring.

Figure 11A:
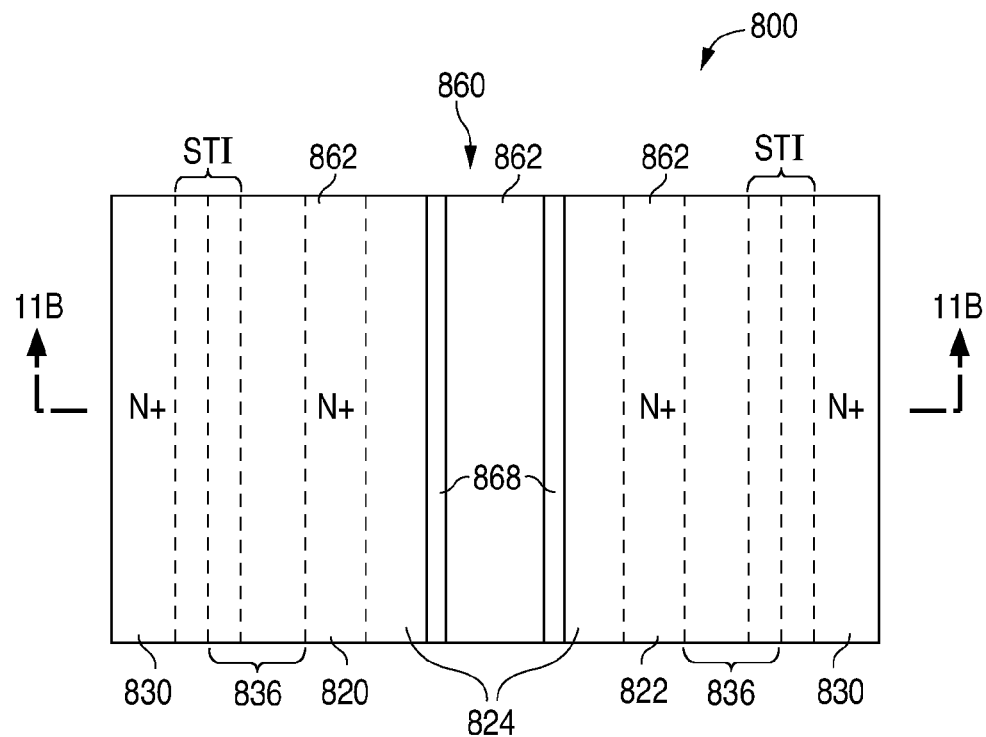
Figure 11B:
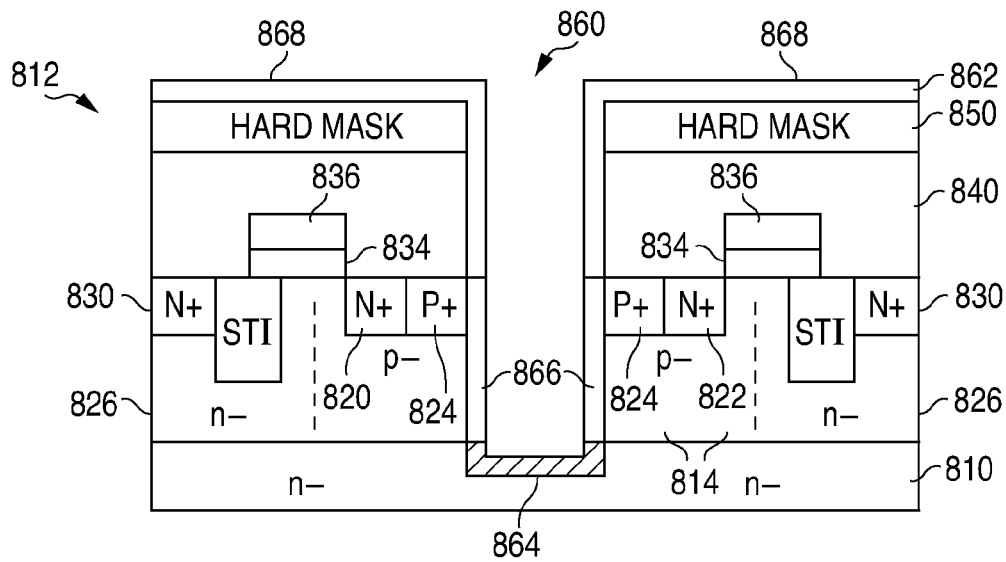

As shown in FIGS. 11A-11B, after the trenches 860 have been formed, a metal layer 862 is deposited in a well-known manner on the top surface of hard mask 850 to touch each p+ contact region 824 (guard region) 224, p-type body region 814, and n-type semiconductor material 810. Metal layer 862, which lines each trench 860, can be implemented with, for example, a layer of platinum.

After metal layer 862 has been deposited, metal layer 862 is heated to react with the underlying semiconductor structures in a conventional manner to form a salicide region 864 that touches n-type semiconductor material 810, a salicide region 866 that touches p+ guard region 824 and p-type body region 814, and a non-salicide region 868 that touches hard mask 850. The salicide regions 864 and 866 are low-resistance silicon-to-metal transition regions. (Metal layer 862 can optionally be etched so that metal layer 862 only touches n-type semiconductor material 810.)

For example, if metal layer 862 is implemented with platinum, the layer of platinum that touches n-type semiconductor material 810 can be converted into platinum salicide region 864 by a conventional sintering process. The portions of p+ guard region 824 and p-type body region 814 that touch metal layer 862 is also salicided at the same time, but the portion of metal layer 862 that touches hard mask 850 does not react, and thereby forms non-salicide region 868.

Figure 12A:
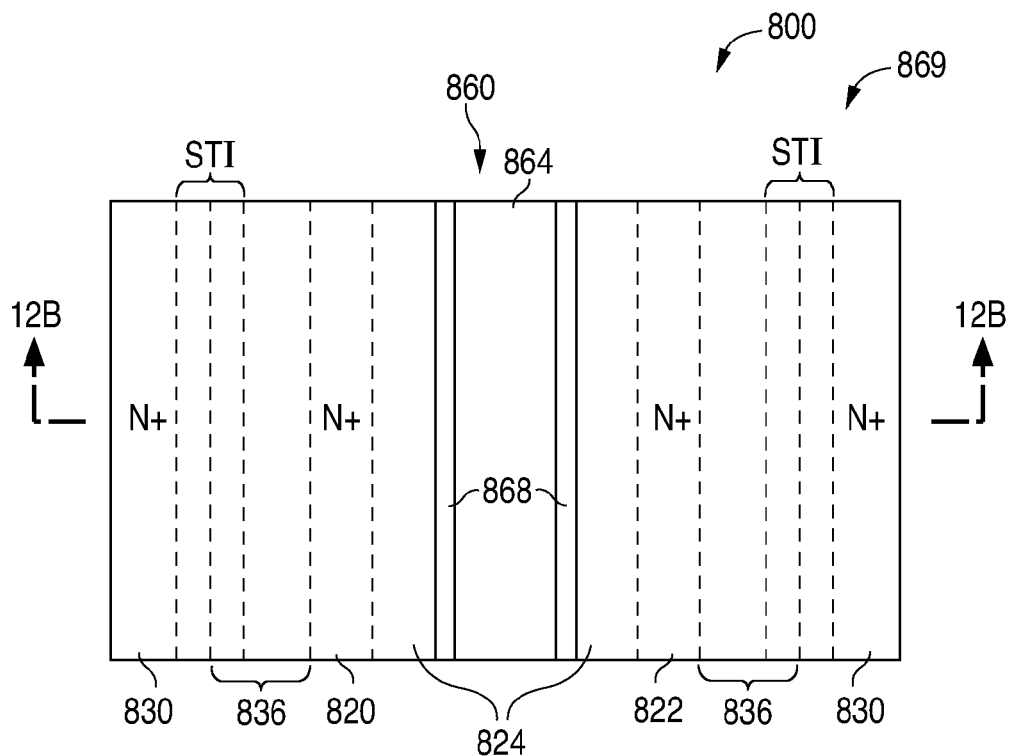
Figure 12B:
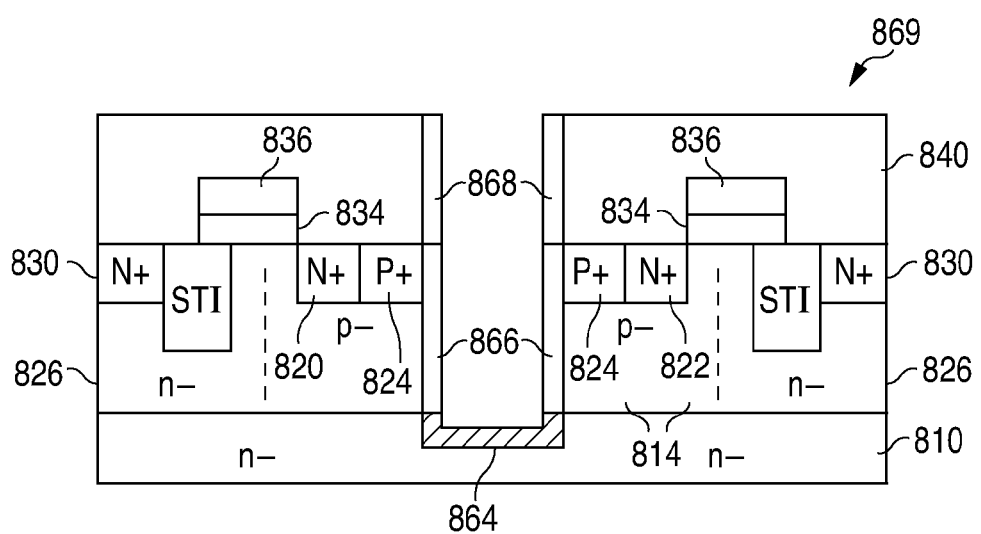

As shown in FIGS. 12A-12B, after metal salicide regions 864 and 866 and non-salicide region 868 have been formed, wafer 800 is planarized in a conventional manner, such as with chemical-mechanical polishing, to remove non-salicide region 868 (the portion of metal layer 862) that lies above hard mask 850). In addition, in the present example, wafer 800 is further planarized to remove hard mask 850 from the top surface of the isolation structure STI to form a Schottky-clamped LDMOS 869.

Figure 13A:
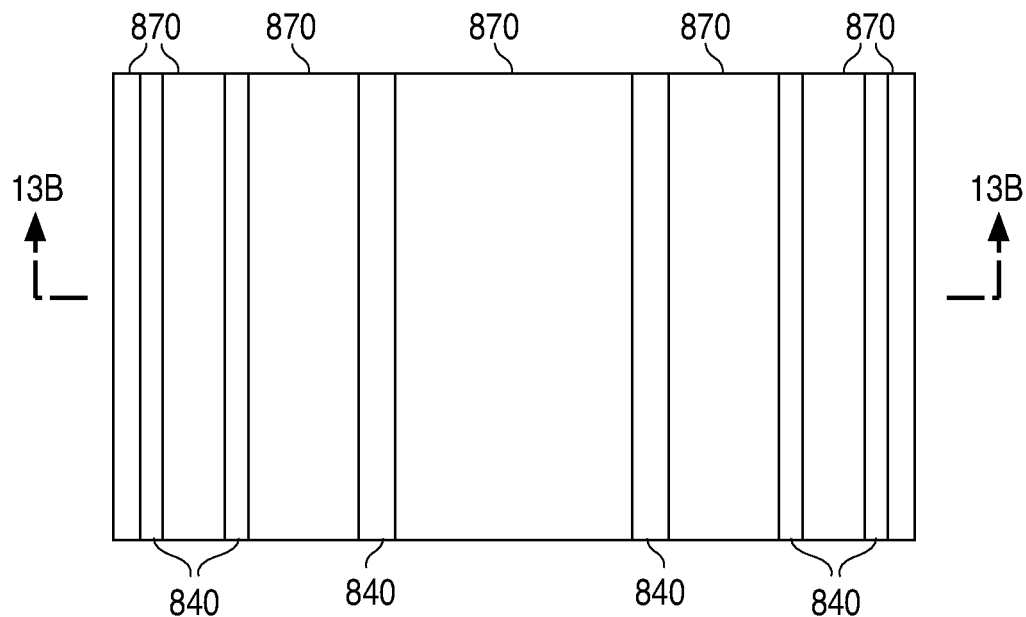
Figure 13B:
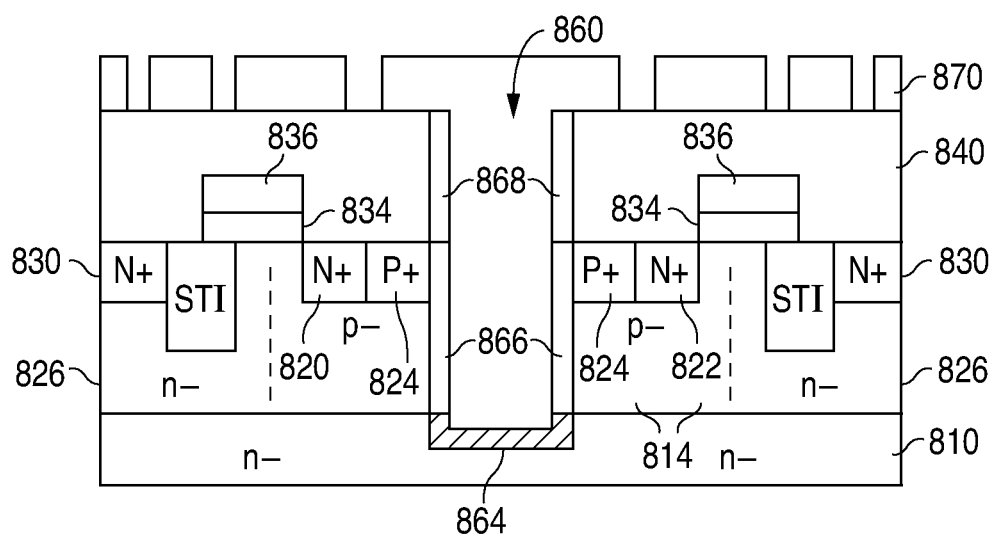

As shown in FIGS. 13A-13B, after hard mask 850 has been removed, a patterned photoresist layer 870 is formed on non-conductive layer 840 and the exposed surface regions of the salicide regions 864, 866, and 868. As a result, as further shown in FIGS. 13A-13B, patterned photoresist layer 870 protects the trenches 860.

Figure 14A:
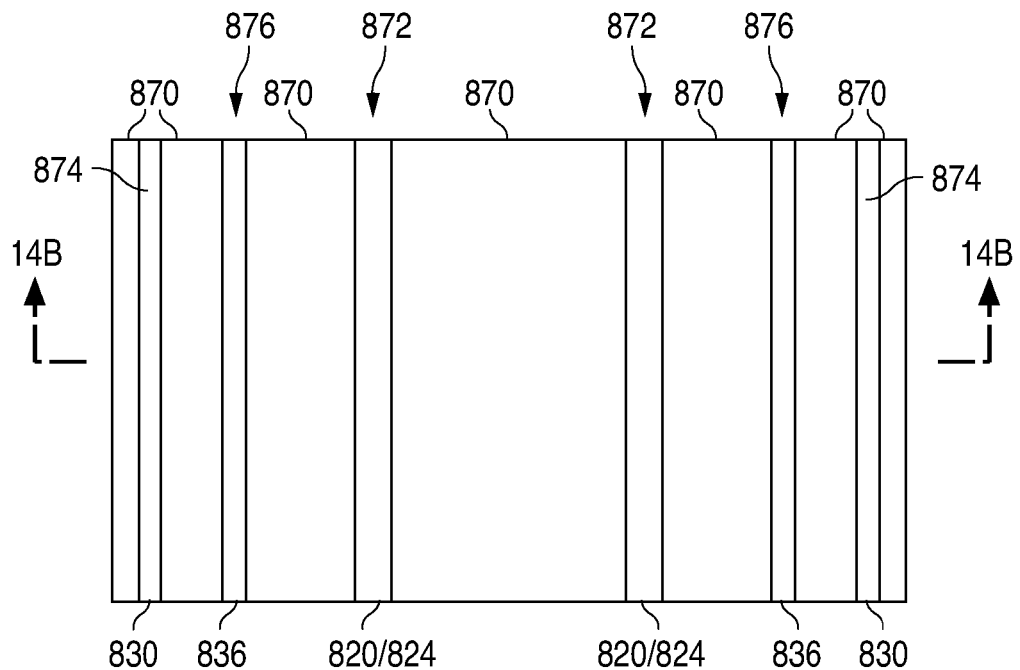
Figure 14B:
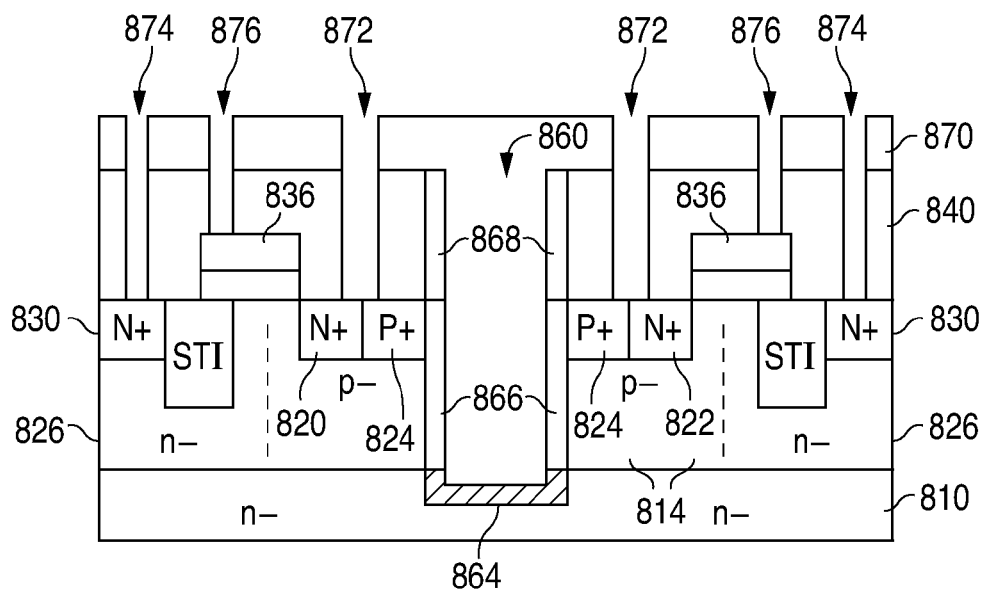

As shown in FIGS. 14A-14B, after patterned photoresist layer 870 has been formed, the exposed regions of non-conductive layer 840 are etched in a conventional manner to form a number of openings. The openings include source openings 872 that expose the source regions 820 and 822 and the p+ contact region 824 in each p-type body region 814, drain openings 874 that expose the drain regions 830, and gate openings 876 that expose the gates 836. Following this, patterned photoresist layer 870 is removed using well-known solvents and processes.

Figure 15A:
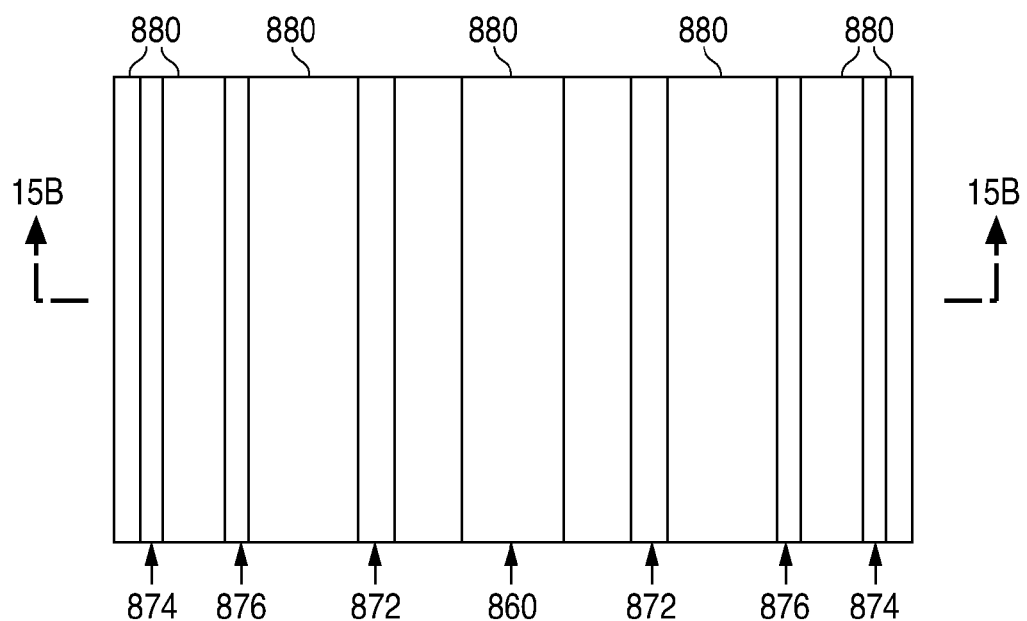
Figure 15B:
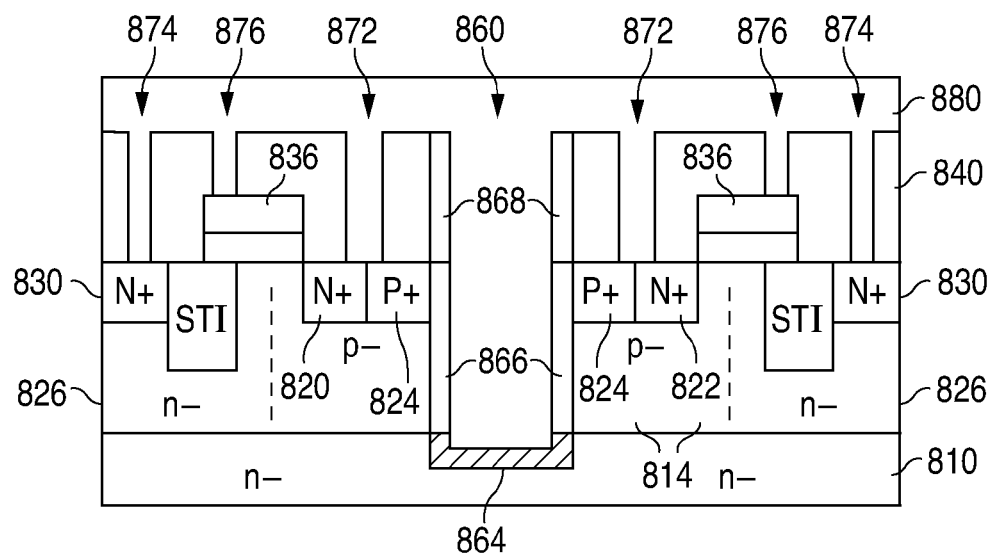

As shown in FIGS. 15A-15B, after patterned photoresist layer 870 has been removed, a contact metal layer 880 is deposited on the top surface of non-conductive layer 840. In addition, contact metal layer 880 also fills up the trenches 860, the source openings 872, the drain openings 874, and the gate openings 876.

Figure 16A:
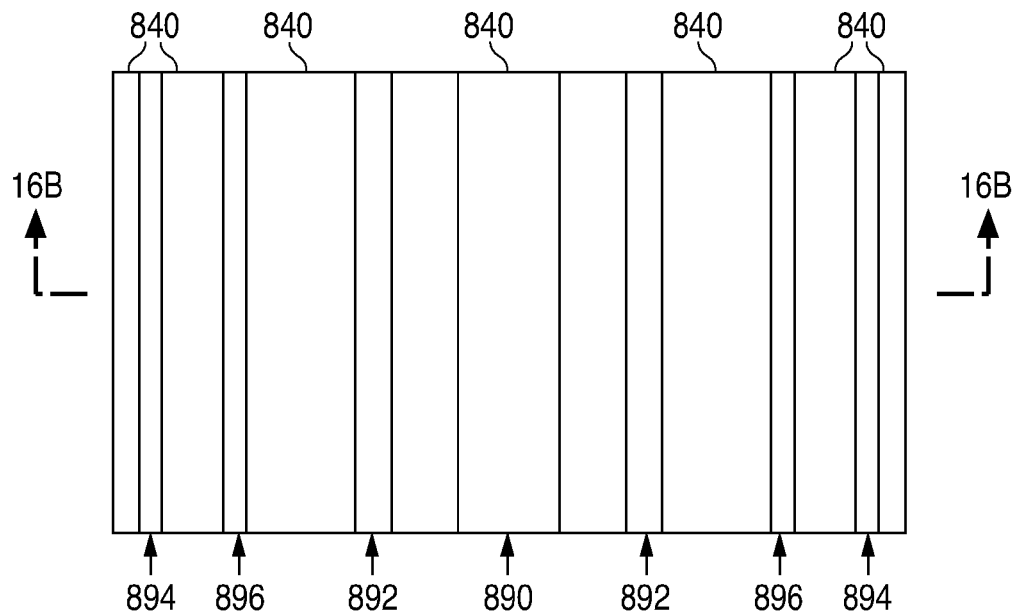
Figure 16B:
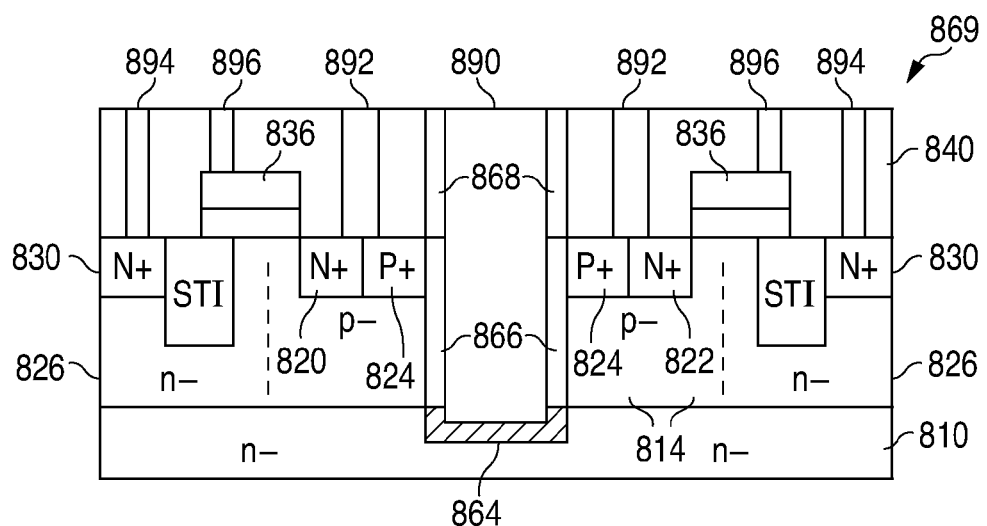

Next, as shown in FIGS. 16A-16B, wafer 800 is planarized in a conventional manner to remove contact metal layer 880 from the top surface of non-conductive layer 840. The planarization forms a number of contacts that make electrical connections with Schottky-clamped LDMOS 869, including trench contacts 890 that each touches a salacided region 864. The planarization also forms a number of source contacts 892 that touch the source regions 820 and 822, and a number of drain contacts 894 that touch the drain regions 830, and a number of gate contacts 896 that touch the gates 836.

Following this, conventional back end processing steps are followed to complete the formation of wafer 800. (The gates 836 and the top surfaces of the p+ contact regions 824, the n+ drain regions 830, and the n+ source regions 820 and 832 can also be salicided to reduce resistivity, and can be salicided when the source, drain, and gate structures are salicided in a standard LDMOS process flow.)

In operation, salacide region 864 functions as the anode of the diode and n-type semiconductor material 810 functions as the cathode of the diode. In addition, the n+ drain regions 830 functions as the cathode contact, while p+ guard region 824 reduces the leakage current. Thus, Schottky-clamped LDMOS 869 prevents the source regions 820 and 822 from being more than a turn-on voltage (e.g., 0.35V) greater than the voltage on the drain regions 830.

Thus, a Schottky-clamped LDMOS and a method of forming a Schottky-clamped LDMOS has been disclosed. One of the advantages of Schottky-clamped LDMOS 869 is that Schottky-clamped LDMOS 869 requires no additional silicon surface real estate. This is because the trench used to form the Schottky diode is formed through the p+ contact region of a standard LDMOS.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A method of forming a Schottky structure in a wafer having a semiconductor material, the method comprising:
    forming an opening in the semiconductor material that extends down from a top surface of the semiconductor material into the semiconductor material, the semiconductor material having a first conductivity type;
    depositing a metal layer that touches the semiconductor material in the opening;
    heating the metal layer to form a salacide region that touches the semiconductor material in the opening
    implanting the semiconductor material with a dopant of a second conductivity type to form a guard ring, the guard ring horizontally surrounding the opening;
    forming a hard mask that touches the top surface of the semiconductor material before the opening is formed in the semiconductor material, the hard mask exposing a region of the top surface of the semiconductor material;
    wherein the region of the semiconductor material exposed by the hard mask is etched to form the opening in the semiconductor material;
    also wherein the metal layer is deposited to touch the hard mask and the guard ring;
    removing the metal layer from a top surface of the hard mask after the salacide region has been formed; and
    removing the hard mask from the top surface of the semiconductor material after the salacide region has been formed.

2. The method of claim 1 wherein the wafer includes a contact region of a second conductivity type, the opening touching and extending through the contact region and into the semiconductor material;
    an isolation structure that touches the contact region;

forming a hard mask on the isolation structure before the opening is formed, the hard mask exposing a region of a top surface of the isolation structure;

wherein the metal layer is deposited to touch the hard mask and the contact region;

removing the metal layer from a top surface of the hard mask after the salacide region has been formed; and further comprising removing the hard mask from the top surface of the isolation structure after the salacide region has been formed.

* * * * *